US009582204B2

(12) United States Patent
Sarcone et al.

(10) Patent No.: US 9,582,204 B2
(45) Date of Patent: Feb. 28, 2017

(54) SPECULATIVE PREFETCHING OF DATA STORED IN FLASH MEMORY

(71) Applicant: Apple Inc., Cupertino, CA (US)

(72) Inventors: Christopher J Sarcone, San Jose, CA (US); Shai Ojalvo, Moshav Olesh (IL)

(73) Assignee: Apple Inc., Cupertino, CA (US)

( * ) Notice: Subject to any disclaimer, the term of this patent is extended or adjusted under 35 U.S.C. 154(b) by 228 days.

(21) Appl. No.: 14/148,910

(22) Filed: Jan. 7, 2014

(65) Prior Publication Data

US 2015/0193155 A1 Jul. 9, 2015

(51) Int. Cl.
| | | |
|---|---|---|
| *G11C 29/00* | (2006.01) |
| *G06F 3/06* | (2006.01) |
| *G06F 12/02* | (2006.01) |
| *G06F 11/10* | (2006.01) |
| *G11C 29/52* | (2006.01) |
| *G06F 12/08* | (2016.01) |

(52) U.S. Cl.
CPC .......... *G06F 3/0619* (2013.01); *G06F 3/0659* (2013.01); *G06F 3/0688* (2013.01); *G06F 11/1072* (2013.01); *G06F 12/0215* (2013.01); *G06F 12/0862* (2013.01); *G11C 29/52* (2013.01); *G06F 2212/6028* (2013.01); *G06F 2212/654* (2013.01); *Y02B 60/1225* (2013.01)

(58) Field of Classification Search
CPC ......... G06F 12/0862; G06F 2212/6028; G06F 3/0619; G06F 12/0215; G06F 2212/654; G06F 3/0659; G06F 11/1072; G06F 3/0688; G11C 29/52
See application file for complete search history.

(56) References Cited

U.S. PATENT DOCUMENTS

| | | | | |
|---|---|---|---|---|
| 7,143,401 | B2* | 11/2006 | Babaian | G06F 9/52 709/248 |
| 8,429,377 | B2* | 4/2013 | Chen | G06F 12/1027 711/206 |
| 2003/0204675 | A1* | 10/2003 | Dover | G06F 12/0862 711/137 |
| 2006/0143187 | A1* | 6/2006 | Mukkamalla | G06F 17/30592 |

(Continued)

FOREIGN PATENT DOCUMENTS

| | | |
|---|---|---|
| EP | 2105838 | 9/2009 |
| EP | 2437177 | 4/2012 |

OTHER PUBLICATIONS

Invitation to Pay Additional Fees and Communication Relating to the Results of the Partial International Search in application No. PCT/US2014/073040 issued Apr. 8, 2015.

(Continued)

*Primary Examiner* — Guy Lamarre
(74) *Attorney, Agent, or Firm* — Meyertons, Hood, Kivlin, Kowert & Goetzel, P.C.

(57) ABSTRACT

A method for data storage, includes holding a definition of a speculative readout mode for readout in a storage device, in which the storage device is requested to read a data unit having a data unit size, and in response the storage device retrieves a storage page that contains the data unit and has a storage page size larger than the data unit size, and retains the storage page in preparation for subsequent requests. Activation of the speculative readout mode is coordinated. A readout command using the speculative readout mode is performed.

13 Claims, 4 Drawing Sheets

(56) References Cited

U.S. PATENT DOCUMENTS

| | | | |
|---|---|---|---|
| 2008/0215849 A1* | 9/2008 | Scott | G06F 17/30949 711/216 |
| 2008/0250230 A1* | 10/2008 | Eickemeyer | G06F 9/3804 712/219 |
| 2009/0113192 A1* | 4/2009 | Hall | G06F 9/381 712/241 |
| 2009/0216936 A1* | 8/2009 | Chu | G06F 12/0246 711/103 |
| 2011/0238962 A1* | 9/2011 | Cain, III | G06F 9/384 712/228 |
| 2012/0317365 A1 | 12/2012 | Elhamias | |

OTHER PUBLICATIONS

Search Report, International Application No. PCT/US2014/073040, mailed Jun. 30, 2015, 7 pages.
Written Opinion, International Application No. PCT/US2014/073040, mailed Jun. 30, 2015, 9 pages.
International Preliminary Report on Patentability in application No. PCT/US2014/073040 issued Jul. 21, 2016.

\* cited by examiner

SPECULATIVE PREFETCHING OF DATA STORED IN FLASH MEMORY

FIELD OF THE INVENTION

The present invention relates generally to data storage, and particularly to methods and systems for prefetching data stored in non-volatile memory.

BACKGROUND OF THE INVENTION

Some computing systems employ Virtual Memory (VM) techniques, which use a fast but small volatile memory and a large but slower non-volatile memory. For example, in some mobile computing and communication devices, the device Operating System (OS) comprises a VM module that jointly operates the device Random Access Memory (RAM) with a Solid State Drive (SSD).

Various methods for using VM are known in the art. For example, U.S. Pat. No. 8,429,377, whose disclosure is incorporated herein by reference, describes a system and a method for accessing a memory. The system comprises a processor device that issues a request for a memory page at a virtual address, and a lookup buffer for storing one or more page table entries, wherein each of the page table entries comprises at least a virtual page number and a physical page number. The system further comprises a logic circuit that receives a virtual address from said processor, and matches the virtual address to the virtual page number in one of the page table entries so as to select the physical page number in the same page table entry. The page table entry comprises one or more bits set to exclude a memory range from a page.

In "Key-Study to Execute Code Using Demand Paging and NAND Flash at Smart Card Scale," Smart Card Research and Advanced Application, Proceedings of the 9th IFIP WG 8.8/11.2 International Conference, CARDIS 2010, Passau, Germany, April 2010, pages 102-117, which is incorporated herein by reference, Geoffroy et al. discuss limitations involved in embedding multiple applications in systems as small as smart cards or sensors. Physical limitations of these systems, such as a very small main memory, and their cost of production, make this very difficult to achieve. One solution proposed in the study is to execute code from a cheaper, denser, but slower secondary memory, such as NAND Flash.

SUMMARY OF THE INVENTION

An embodiment of the present invention provides a method including holding a definition of a speculative readout mode for readout in a storage device, in which the storage device is requested to read a data unit having a data unit size, and in response the storage device retrieves a storage page that contains the data unit and has a storage page size larger than the data unit size, and retains the storage page in preparation for subsequent requests. Activation of the speculative readout mode is coordinated. A readout command is performed using the speculative readout mode.

In some embodiments, coordinating the activation includes receiving in the storage device a command to read a single data unit, and performing the readout command includes reading the single data unit from the retained storage page. In other embodiments, performing the readout command includes reporting an error event upon detecting that the single data unit is not in the retained storage page. In yet other embodiments, performing the readout command further includes discarding the retained storage page after all the data units in the retained storage page have been requested.

In an embodiment, performing the readout command includes receiving in the storage device a request to read a given data unit in the retained storage page, and returning the given data unit and all the consecutive data units from the retained storage page. In another embodiment, coordinating the activation includes reporting the storage page size from the storage device. In yet another embodiment, the method further includes receiving in the storage device a write command for storing data whose size equals the storage page size, and storing the data aligned to a page boundary of the storage device.

There is additionally provided, in accordance with a storage device including a non-volatile memory and a processor. The processor is configured to hold a definition of a speculative readout mode, in which the storage device is requested to read a data unit having a data unit size, and in response the storage device retrieves from the non-volatile memory a storage page that contains the data unit and has a storage page size larger than the data unit size, and retains the storage page in preparation for subsequent requests, to coordinate activation of the speculative readout mode, and to perform a readout command using the speculative readout mode.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for Virtual Memory (VM) operation. In many storage systems, the space that an Operating System (OS) allocates for a given process in the volatile memory of the host (referred to herein as "local memory") is insufficient to include the entire code and data of the process. This scenario may occur, for example, when the total storage space of the local memory is smaller than the space that the process requires, or when the OS runs multiple processes concurrently.

In some embodiments, the OS comprises a Virtual Memory (VM) subsystem, which manages the memory for processes that run in the local memory. In the embodiments described herein, the VM manages the local memory and a large non-volatile memory such as a Flash-based Solid State Drive (SSD). The VM enables a process to use a memory space that is larger than the space allocated for that process by the OS. Occasionally, the process may attempt to access data that is currently unavailable locally. Such an event is referred to as a page fault event. The VM typically responds to page faults by fetching the data in question from the SSD.

The VM accesses data in the SSD in units that are referred to herein as data chunks or data units. Upon detecting (or receiving an indication of) a page fault, the VM fetches the respective missing data from the SSD by requesting the data chunk to which the missing data belongs (also referred to as the missing chunk). In some embodiments, to improve the access rate to missing data, the VM may be configured to fetch one or more consecutive data chunks in addition to the missing chunk. This operating mode is referred to as speculative prefetching. Speculative prefetching in SSD-based storage systems, however, can be problematic as described further below.

Typically, the OS further comprises a File System (FS) subsystem that manages the storage of data (e.g., user or other data) in logical structures, such as files and directories. The FS stores files in the SSD. A computer program may execute or otherwise use one or more files. For example, an application program may access a large number of small files, such as executable and multimedia files. When executing an application, the FS first uploads the respective application files from the SSD to the local memory, and the host then executes the application from the local memory. The process of uploading the files of an application is referred to as application launch. Since the application files should be uploaded prior to execution, shorter application launch duration results in better user experience.

In the host, the VM and FS subsystems of the OS typically manage the memory in a continuous space of logical addresses. The SSD typically comprises a SSD controller that manages the storage in physical addresses of the Flash memories. Logical addresses correspond to respective physical addresses of data chunks in the Flash memories. The SSD controller typically maintains a translation table between logical and physical addresses.

The SSD controller stores data in the SSD in units that are referred to as storage pages, or simply pages for brevity. In some cases, the VM (or FS) is configured to fetch data chunks that are smaller than the page size of the SSD. In other words, a page in the SSD typically comprises multiple data chunks of which the VM may request one at a time. As described below, this size mismatch between storage pages and data chunks may eliminate potential advantages of speculative prefetching.

In some embodiments, the OS reads data in units that are referred to herein as chunks or segments. The chunk size can be, for example, 512 bytes or 4 Kilobytes (KB). Data in the SSD, on the other hand, is written and retrieved from the Flash memories in storage pages, whose size is typically larger than the chunk size. Example page sizes include 8 KB, 16 KB, and 32 KB.

In an embodiment, in response to a page fault event, the VM requests the respective missing chunk (i.e., the chunk to which the missing data that created the page fault belongs) from the SSD. In principle, the VM can perform speculative prefetching by requesting, in addition to the missing chunk, one or more consecutive chunks. This prefetching operation, however, would not improve the rate of accessing missing data, since per each chunk request the SSD retrieves an entire page, even when the VM requests multiple chucks within the same page. Moreover, such redundant operations of page retrieval cause increased power consumption, which shortens the battery life of the system.

In the disclosed techniques, when the VM requests a missing chunk, the page that contains this chunk is retrieved and cached in the SSD. When the VM then requests one or more chunks that are already cached (e.g., when performing speculative prefetching), these chunks are read from the cached page without generating unnecessary re-reading of the respective page from the SSD.

In the description that follows, we assume an underlying SSD storage that comprises an SSD controller, and a volatile cache memory. For the sake of clarity, unless otherwise stated, we refer to the non-volatile memory of the SSD as "Flash memory." The Flash memory can comprise any suitable number of individual Flash devices.

In an embodiment, the host VM issues to the SSD a request for retrieving a missing chunk, and additionally indicates to the SSD controller of a speculative prefetching operation. The SSD controller retrieves the page to which the requested chunk belongs from the Flash memory, and caches the page in the cache memory. The SSD controller delivers the requested chunk to the host, and retains the cached page until the VM requests all the other chunks of the cached page.

In an embodiment, the VM reads chunks that are part of a page that is already cached in the SSD, by instructing the SSD controller to read each such chunk from the cached page without re-reading the entire page from the Flash memory. When the VM requests a cached chunk, but the requested chunk is not in the cached page, the SSD controller returns a respective error indication to the VM. The VM can then read that chunk with or without caching the respective page. Reading a cached chunk is faster than reading the chunk from the Flash memory.

In some embodiments, the VM performs speculative prefetching by requesting a missing chunk and additionally notifying the SSD of the speculative prefetching operation. The SSD retrieves the page to which the requested chunk belongs from the Flash memory, caches the page, and returns the requested chunk to the host, as well as all the consecutive chunks in the cached page.

Speculative prefetching can, in principle, be more efficient when a single VM request causes the SSD controller to retrieve chunks with alignment to page boundaries. The VM, however, does not have explicit knowledge of the position of individual chunks in the page, and therefore the VM cannot explicitly request chunks that are aligned to page boundaries.

In an embodiment, the SSD controller reports the page size used in the Flash memory to the VM. The VM then stores data in units having the received page size, while additionally instructing the SSD controller to store each such unit with alignment to page boundaries in the Flash memory. When the VM later reads the respective stored data, the VM performs speculative prefetching, as described above, by requesting the first chunk in a page, and in response to the speculative prefetching request, the SSD reads and caches the page to which the first chunk belongs, and delivers the entire page to the host.

When launching an application, it can be advantageous to perform speculative prefetching to reduce the launch duration, for example, when the application files are consecutively stored in the Flash memory. When uploading each of the application files, however, the FS is unaware that the files are common to an application program, and has no explicit indication to switch to speculative prefetching mode when uploading these files. In an embodiment, the OS indicates to the FS when initiating an application launch. In response, the FS then switches to read the respective application files in speculative prefetching mode.

In some embodiments, the OS indicates to the SSD controller when starting and terminating an application launch. In response, the SSD monitors and records the logical and respective physical addresses of the uploaded files of the launched application. The SSD controller then re-arranges the application files consecutively in a contiguous range of physical addresses in the Flash memory, to enable subsequent efficient launching of the same application using speculative prefetching.

In alternative embodiments, the OS indicates to the FS (rather than to the SSD) whenever the OS initiates and terminates an application launch. The FS records the logical addresses of the uploaded application files, and sends the recorded addresses to the SSD controller using a dedicated defragmentation command. The SSD controller then re-arranges the application files consecutively in the Flash memory, and updates the address translation table accordingly.

The disclosed techniques enable to perform speculative prefetching to improve the rate of accessing missing data upon detecting page fault events, and to reduce the duration of launching applications, while refraining from unnecessary read operations from the Flash memory. The disclosed techniques thus improve reading latency, power consumption, and battery life time of the system.

System Description

Figure 1:
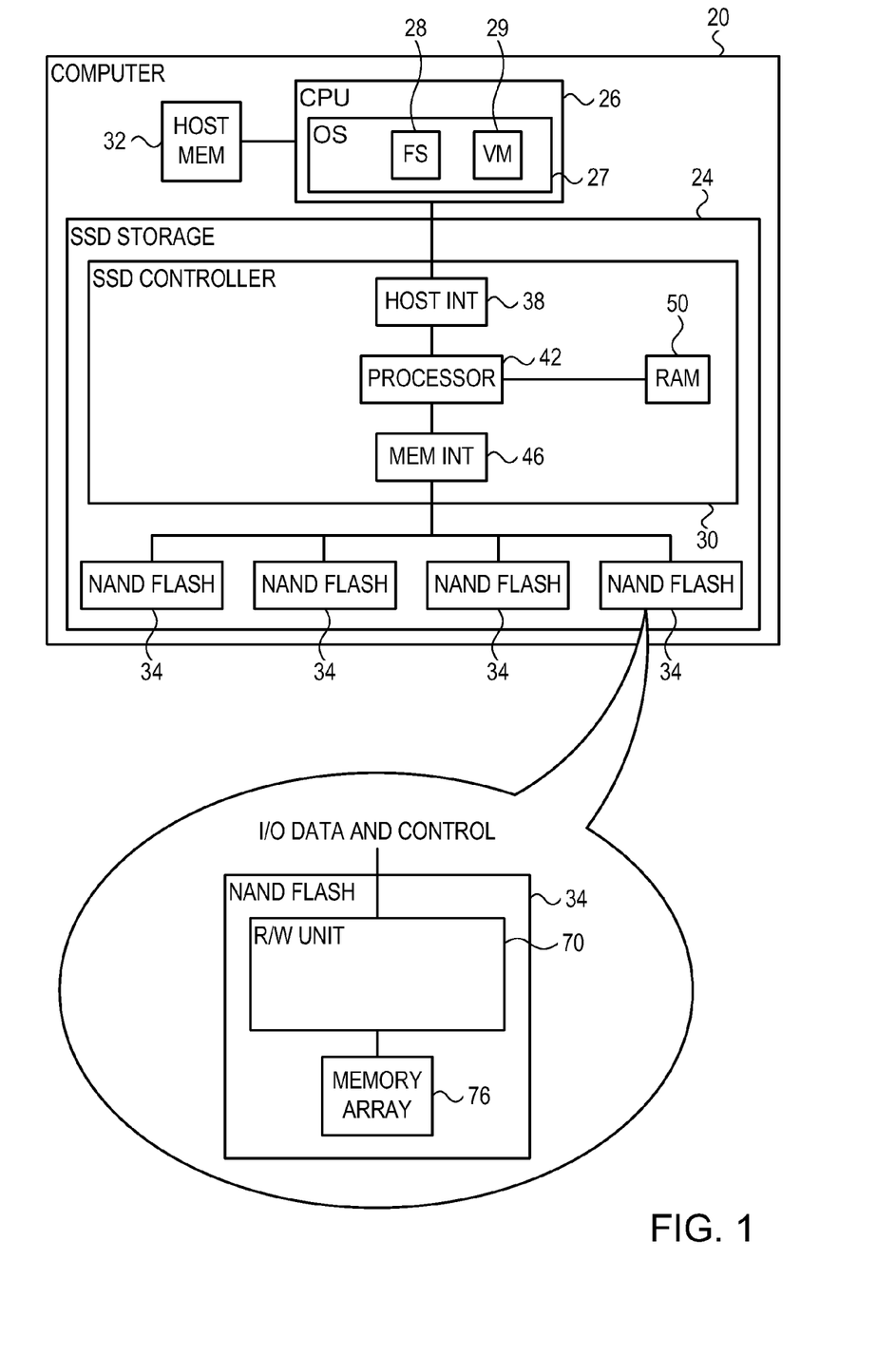
FIG. 1 is a block diagram that schematically illustrates a storage system, in accordance with an embodiment of the present invention.

FIG. 1 is a block diagram that schematically illustrates a memory system, in accordance with an embodiment of the present invention. In the present example, the memory system comprises a computer 20 that stores data in a Solid state Drive (SSD) 24. Computer 20 may comprise, for example, a mobile, tablet or personal computer. The computer comprises a Central Processing Unit (CPU) 26 that serves as a host. In the description that follows, the terms CPU and host are used interchangeably.

In alternative embodiments, the host may comprise any other suitable processor or controller, and the storage device may comprise any other suitable device. For example, the host may comprise a storage controller of an enterprise storage system, and the storage device may comprise an SSD or an array of SSDs. Other examples of hosts that store data in non-volatile storage devices comprise mobile phones, digital cameras, media players and removable memory cards or devices.

In an embodiment, CPU 26 runs an Operating System (OS) 27 that handles the various tasks of computer 20. The OS further comprises a File system (FS) 28, and a Virtual Memory (VM) subsystem 29. FS 28 handles the organization of user (and other) data in logical structures such as directories and files. VM 29 manages the memory for processes that the FS uploads to, and the OS executes from a volatile host memory 32. Memory 32 is also referred to as a local memory. Memory 32 may comprise any suitable type of volatile memory, such as, for example, DDR, DDR2, DDR3, DDR3L, SDRAM, or RDRAM. In a typical application, memory 32 has a size between 1 GB and 32 GB, although any other suitable size can also be used.

SSD 24 stores data for CPU 26 in a non-volatile memory, in the present example in one or more NAND Flash memory devices 34. In alternative embodiments, the non-volatile memory in SSD 24 may comprise any other suitable type of non-volatile memory, such as, for example, NOR Flash, Charge Trap Flash (CTF), Phase Change RAM (PRAM), Magnetoresistive RAM (MRAM) or Ferroelectric RAM (FeRAM).

An SSD controller 30 performs the various storage and management tasks of the SSD. The SSD controller is also referred to generally as a memory controller. SSD controller 30 comprises a host interface 38 for communicating with CPU 26, a memory interface 46 for communicating with Flash devices 34, and a processor 42 that carries out the various processing tasks of the SSD.

SSD 24 further comprises a volatile memory, in the present example a Random Access Memory (RAM) 50. In the embodiment of FIG. 1, RAM 50 is shown as part of SSD controller 30, although the RAM may alternatively be separate from the SSD controller. RAM 50 may comprise, for example, a Static RAM (SRAM), a Dynamic RAM (DRAM), a combination of the two RAM types, or any other suitable type of volatile memory. RAM 50 may be used for caching data read from Flash devices 34 before delivering the data or parts thereof to CPU 26 or to host memory 32. As described below, in some embodiments, RAM 50 caches a data page of which, upon request, one or more data chunks are delivered to CPU 26.

The bottom part of FIG. 1 depicts an exemplary detailed block diagram of NAND Flash device 34. In the present example, device 34 comprises a reading/writing (R/W) unit 70, which converts data for storage in the memory device to storage values and writes them into memory cells (e.g., analog memory cells) of a Flash memory array 76. In alternative embodiments, the R/W unit does not perform the conversion, but is provided with voltage samples, i.e., with the storage values for storage in the cells. The R/W unit typically (although not necessarily) programs the memory cells using an iterative Program and Verify (P&V) process, as is known in the art. When reading data out of array 76, R/W unit 70 converts the storage values of the memory cells into digital samples having a resolution of one or more bits. Data is typically written to and read from the memory cells in groups that are referred to as data pages or simply pages. Flash devices, such as devices 34, typically comprise 8 KB, 16 KB or 32 KB pages. In some embodiments, the R/W unit can erase a group of cells in memory array 76, e.g., a block comprising multiple pages, by applying one or more negative erasure pulses to the cells.

Memory array 76 may comprise a Single-Level Cell (SLC) memory array that stores 1 bit/cell using two programming levels, or a Multi-Level Cell (MLC) memory array that stores N bits/cell in $2^N$ programming levels. For example, a 2 bits/cell device uses four programming levels, and a 3 bits/cell device uses eight programming levels.

Some memory devices comprise two or more separate memory cell arrays, often referred to as planes. For example, in a two-plane device in which each plane comprises 16 KB pages, the SSD controller can retrieve 32 KB in a single read operation using multi-plane access methods.

Processor 42 of SSD controller 30 typically maintains a logical-to-physical address translation, which associates the logical addresses specified by the host with respective physical storage locations (also referred to as physical addresses) in Flash devices 34, and stores the data in the appropriate physical storage locations. The logical-to-physical address translation (also referred to as Virtual-to-Physical mapping—V2P) may be stored in RAM 50, in Flash devices 34, or in both.

The logical and respective physical addresses access data units that are referred to herein as data chunks. In some embodiments, the size of a data page is larger than the size of a data chunk. For example, the VM may be configured with data chunks of 4 KB, and the Flash memories with pages of 16 KB in size. Typically, although not necessary, a data page comprises an integer number of data chunks.

SSD controller 30, and in particular processor 42, may be implemented in hardware. Alternatively, the SSD controller may comprise a microprocessor that runs suitable software, or a combination of hardware and software elements.

The configuration of FIG. 1 is an exemplary configuration, which is shown purely for the sake of conceptual clarity. Any other suitable SSD or other memory system configuration can also be used. Elements that are not necessary for understanding the principles of the present invention, such as various interfaces, addressing circuits, timing and sequencing circuits and debugging circuits, have been omitted from the figure for clarity. In some applications, e.g., non-SSD applications, the functions of SSD controller 30 are carried out by a suitable memory controller.

In the exemplary system configuration shown in FIG. 1, memory devices 34 and SSD controller 30 are implemented as separate Integrated Circuits (ICs). In alternative embodiments, however, the memory devices and the SSD controller may be integrated on separate semiconductor dies in a single Multi-Chip Package (MCP) or System on Chip (SoC), and may be interconnected by an internal bus. Further alternatively, some or all of the SSD controller circuitry may reside on the same die on which one or more of memory devices 34 are disposed. Further alternatively, some or all of the functionality of SSD controller 30 can be implemented in software and carried out by CPU 26 or other processor in the computer. In some embodiments, CPU 26 and SSD controller 30 may be fabricated on the same die, or on separate dies in the same device package.

In some embodiments, processor 42 and/or CPU 26 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

VM Prefetching in SSD-Based Storage Systems

In the description that follows, we assume that VM fetches data from Flash memories 34 in chunks or segments of a fixed size. In some embodiments, SSD controller 30 informs OS 27 of the minimal unit size for data transfer over host interface 38, i.e., the chunk size, such as, for example 512 bytes or 4 KB. In the description that follows we assume a 4 KB chunk size. Alternatively, however, any other suitable chunk size can also be used.

When a software process or application that is executed by OS 27 from host memory 32 needs to access data that is unavailable locally in memory 32, a page fault event occurs. When a page fault occurs, the VM issues one or more I/O requests to the SSD controller to fetch the missing data from respective Flash memories 34. The data chunk to which the missing data belongs is also referred to as the missing chunk. Although the VM can fetch only a single chunk at a time (i.e., the missing chunk), in many cases, as the execution of the software process progresses, the VM will have to fetch, with high probability, additional consecutive data chunks. It is therefore typically more efficient to fetch a continuous range of multiple chunks rather than just the missing chunk. In the context of the present invention and in the claims, the term "speculative prefetching" refers to fetching one or more additional chunks consecutively to the missing chunk.

In speculative prefetching the fetched chunks may include one or more chunks that precede the missing chunk.

As demonstrated below, configuring VM 29 to operate in speculative prefetching mode may produce redundant read operations from Flash memories 34, resulting in increased latency and power consumption. Assume, for example, that each of Flash memories 34 stores 16 KB pages. When VM 29 requests a single 4 KB data chunk, the SSD controller should read the entire 16 KB page to which this chunk belongs, and deliver to host 26 only the requested chunk. If subsequent VM requests access other pages, the other three read chunks (12 KB in this example) are not utilized. Moreover, when VM 29 speculatively requests multiple 4 KB chunks, which are all located in the same page, each individual VM request generates a separate read operation of the entire 16 KB page and for each such read operation only 4 KB of the 16 KB page are delivered to host 26. As can be seen, the above examples demonstrate a bandwidth utilization of only 25% (4 KB out of 16 KB).

The disclosed techniques that are described below enable the VM to perform speculative prefetching without wasting bandwidth and power consumption. In the disclosed techniques, by defining new VM operations, the SSD controller can read and cache a data page once, and deliver the cached data chunks of that page to the host upon request.

Methods for Efficient Speculative Prefetching

Figure 2:
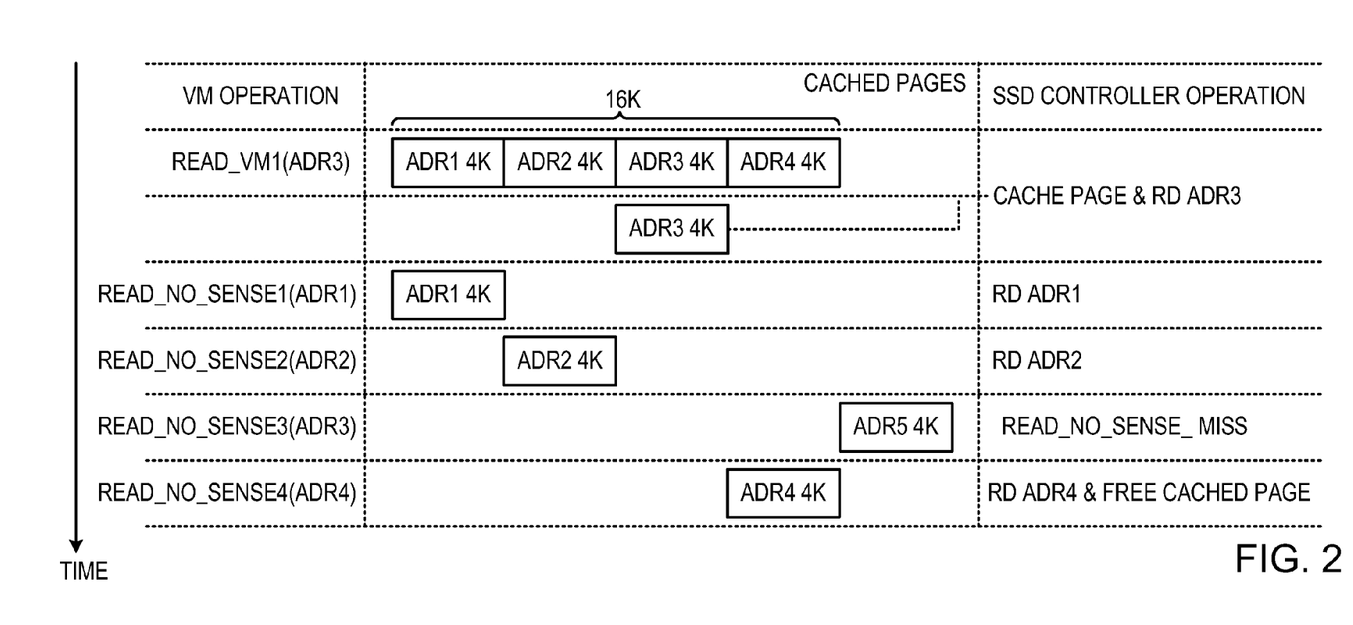
FIGS. 2-4 are diagrams that schematically illustrate data caching and reading as part of speculative prefetching.
Figure 3:
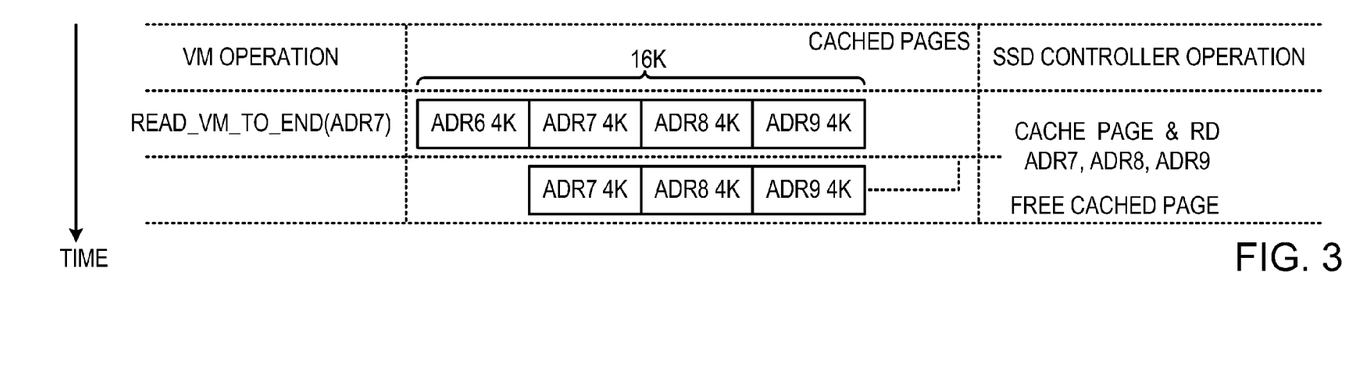
Figure 4:
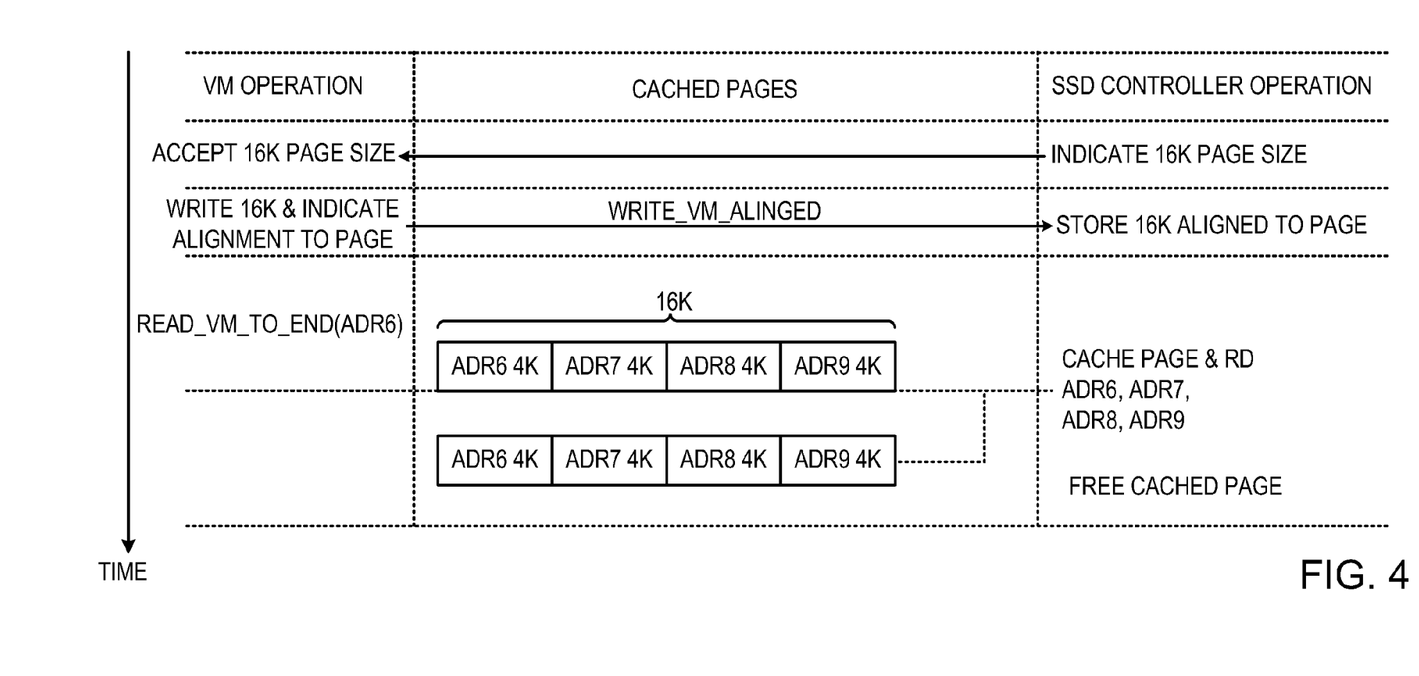

FIGS. 2-4 are diagrams that schematically illustrate data caching and reading as part of speculative prefetching. The diagram depicted in each of the FIGS. 2-4, comprises three columns. The leftmost and rightmost columns refer to operations performed by VM 29 and by SSD controller 30 respectively. In each diagram the middle column depicts a cached 16 KB page comprising four 4 KB data chunks. Each diagram further comprises multiple lines, depicting a single VM operation and respective SSD controller operation per line. Each diagram thus depicts a sequence of VM operations performed over time. In the diagrams of FIGS. 2-4, each 4 KB chunk is identified by its respective physical address such as ADR1, ADR2 and so on. Thus, the ADR3 chunk, for example, refers to the data chunk whose physical address in the Flash memories is ADR3. In the disclosed methods, the SSD controller caches pages that are retrieved from Flash memories 34 in RAM 50.

We now refer to FIG. 2. In the present example we assume a 16 KB page comprising four sequential 4 KB chunks whose physical addresses are denoted ADR1-ADR4. In the first operation, namely READ_VM1(ADR3), the VM requests the ADR3 chunk, but additionally indicates to SSD controller 30 of a speculative prefetching operation. SSD controller 30 responds by reading the 16 KB page in which the requested chunk is stored in the Flash memories and caches the page in RAM 50. The cached page comprises the chunks ADR1-ADR4. SSD controller 30 then delivers to host 26 only the ADR3 chunk from the cached page.

The VM next performs a READ_NO_SENSE(ADR1) operation, in which the VM requests the ADR1 chunk, indicating to read the chunk from the cached page. SSD controller 30 responds by reading the cached ADR1 chunk and delivering it to host 26 without re-reading the entire 16 KB page. Next, VM 29 similarly performs a READ_NO_SENSE(ADR2) operation to cause SSD controller 30 to read and deliver to the host the cached ADR2 chunk.

When performing the READ_NO_SENSE(ADR5) operation, the VM requests the ADR5 chunk, which is not part of the cached chunks ADR1-ADR4. As a result, SSD controller 30 responds by indicating to the VM a READ_NO_SENSE_MISS error event. The miss event indicates to the VM that the requested chunk is not yet cached and cannot be read using the READ_NO_SENSE operation.

When the VM requests the ADR4 chunk using the READ_NO_SENSE(ADR4) operation, SSD controller 30 reads the cached ADR4 chunk and delivers it to the host. Since by this operation the VM completes requesting all the cached chunks ADR1-ADR4 (not necessarily in sequential order), the SSD controller additionally frees the cached page to enable using the same memory space in RAM 50 for caching other pages.

FIG. 3 describes another method for speculative prefetching. In an embodiment, although the VM requests a single 4 KB chunk, the VM prepares to accept from SSD controller 30 up to the entire 16 KB page to which the requested chunk belongs. In the example of FIG. 3, VM 29 issues a VM operation, i.e., READ_VM_TO_END(ADR7) to fetch the ADR7 chunk. SSD controller 30 responds by reading and caching the page that comprises the four consecutive chunks ADR6-ADR9, and delivers to the host only the requested as well as all the consecutive chunks (a read to end of page operation), i.e., ADR7-ADR9. Additionally, along with the data chunks, SSD controller 30 delivers to the VM the number of the delivered chunks and their respective logical addresses. Following the delivery of the data chunks, SSD controller 30 frees the cached page for caching other pages. The feature of reading to the end of page saves redundant requests by the VM that would otherwise be issued separately per individual data chunks (typically involving per chunk memory sense and read operations), and therefore makes Direct Memory Access (DMA) operations of the OS more efficient.

FIG. 4 describes yet another method for efficient speculative prefetching. The method enables fetching data chunks that were previously stored with alignment with to the physical addresses of page boundaries. In the example of FIG. 4, SSD controller 30 first indicates to VM 29 of the page size, in the present example 16 KB. The VM accepts the indicated page size, to be used in subsequent VM operations. VM 29 then issues a WRITE_VM_ALINGED command to SSD controller 30 to write 16 KB of data aligned to page boundaries. SSD controller 30 accepts the WRITE_VM_ALINGED command and stores the 16 KB data in consecutive four chunks so that the physical address of the first chunk matches the physical address of a complete page. In the example of FIG. 4 the four chunks (of the 16 KB data) to be written, are stored in a page whose address is ADR6. Since the VM is aware of the logical addresses of any data that was written aligned to page boundaries, the VM can speculatively later read this data as complete pages.

In a later occasion, the VM performs a READ_VM_TO_END(ADR6) operation to request the page that stores the ADR6=ADR9 chunks. SSD controller 30 responds to this command by caching the entire respective page, delivering the four ADR6-ADR9 chunks to the host, and freeing up the cached page.

In some embodiments, the SSD controller applies a block compaction process, also referred to as "garbage collection" (GC). In this process, the SSD controller copies valid data from partially-valid source blocks into one or more destination blocks. Since GC typically copies entire blocks or pages, data that was written aligned to page boundaries, as described above, retains its alignment even after copied by the GC process.

Figure 5:
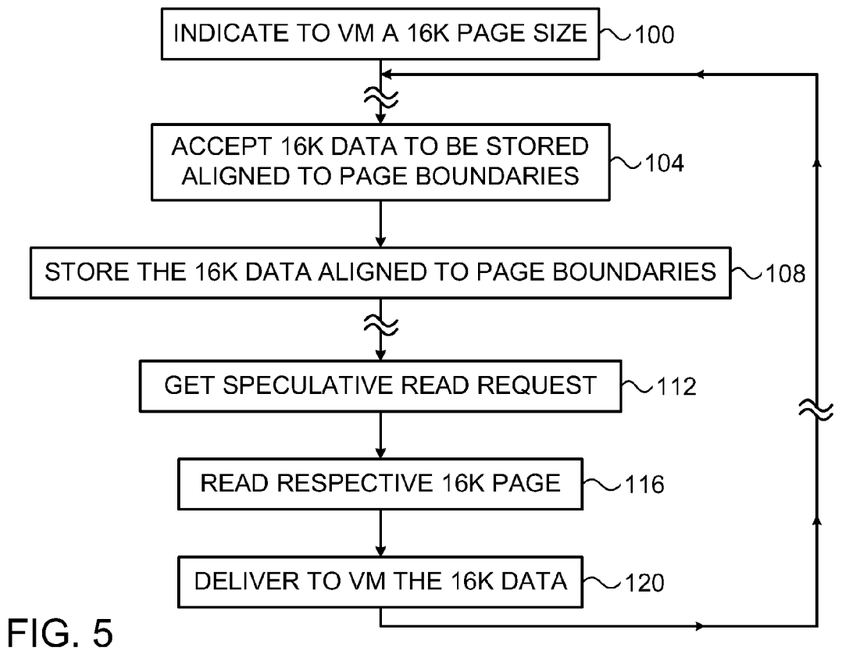
FIG. 5 is a flow chart that schematically illustrates a method for speculative data prefetching by storing the data aligned to page boundaries, in accordance with an embodiment of the present invention.

FIG. 5 is a flow chart that schematically illustrates a method for speculative prefetching by initially storing the data aligned to page boundaries, in accordance with an embodiment of the present invention. The method is executed by SSD controller 30, and begins by SSD controller 30 indicating to VM 29 of the page size of Flash memories 34, at an indication step 100. In the example of FIG. 5, the page size is 16 KB. As described herein, VM 29 uses the indicated page size to write data chunks aligned to page boundaries, which enables efficient speculative prefetching of this data.

At a receiving command step 104, SSD controller 30 accepts from the VM 16 KB of data to be stored using the WRITE_VM_ALIGNMENT command (described above). At a storing aligned step 108, SSD controller 30 selects a respective page in Flash memories 34, and stores the four 4 KB chunks comprising the 16 KB data, aligned to the boundaries of selected page. VM 29 keeps track of the logical addresses of the 16 KB data pages, which are stored aligned to physical page boundaries. At a receiving speculative read command step 112, SSD controller 30 accepts from VM 29 a request to speculatively read the entire page that was stored at step 108.

At step 116, SSD controller 30 translates the logical address of the requested page to a respective physical address, reads the page data and caches the page in RAM 50. At step 116 the VM can use, for example, the READ_VM_TO_END operation (described above), or a dedicated other VM operation that delivers the entire cached page to the host. The SSD controller then delivers the 16 KB of the cached page to VM 29 via host interface 38, at a page delivery step 120. Further at step 120, the SSD controller frees the cached page in RAM 50, so as to enable reuse the same memory space for caching other pages.

Fast Application Launch

An application program often accesses a large number of relatively small files, which FS 28 stores in Flash memories 34 when the application is installed. The application files may comprise executable files, bitmap files, multimedia files, and the like. In some embodiments, when OS 26 launches an application, FS 28 uploads the files of the application from respective locations in Flash memories 34 to host memory 32 for execution. FS 28 uploads the application files by sending to SSD controller 30 a plurality of respective read commands. The duration it takes to launch the application files should be short so that the user suffers minimal delay before he can use the application.

Various methods for speeding up the launch duration of applications are known in the art. Example methods are described by Yongsoo et al., in "FAST: quick application launch on solid-state drives," Proceedings of the 9th USENIX conference on File and storage technologies, pages 259-272, Feb. 15-17, 2011, San Jose, USA, which is incorporated herein by reference.

In some embodiments that are described herein, FS 28 uses speculative prefetching to reduce the duration of launching applications. For example, FS 28 can use speculative prefetching methods as described in FIGS. 2-4 above.

In an example embodiment, the application files are consecutively stored in a contiguous range of physical addresses in one of the Flash memories. Upon receiving identifications of the application files from OS 27, it would have been possible for FS 28, to separately read each of the application files from the Flash memory with speculative prefetching disabled. This, however would result in redundant read operations in the Flash memory and therefore with long launch duration, especially when the size of the files is on the order of the chunk size (e.g., 4 KB), or less.

In a disclosed embodiment, in addition to providing the identification of the application files, OS 27 hints to FS 28 that the files commonly belong to an application program. Upon receiving this hint, FS 28 automatically switches to speculative prefetching mode in which FS 28 uses speculative prefetching, such as described above in relation to FIGS. 2-4, to efficiently read multiple 4 KB chunks.

Figure 6:
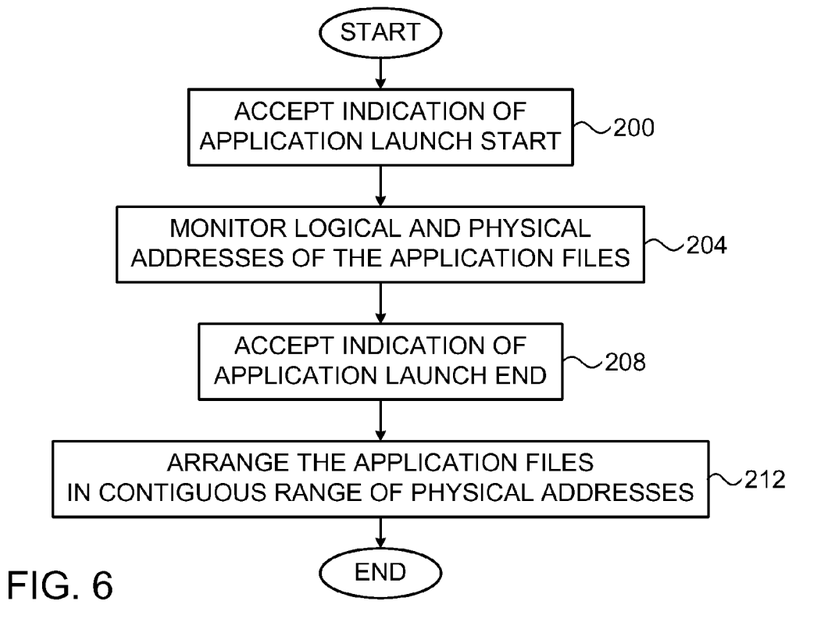
FIG. 6 is a flow chart that schematically illustrates a method for reducing the launch duration of applications, in accordance with an embodiment of the present invention.

FIG. 6 is a flow chart that schematically illustrates a method for reducing the launch duration of applications, in accordance with an embodiment of the present invention. The method is executed by SSD controller 30, and begins by the SSD controller accepting an indication or hint from OS 27 that an application launch process has started, at a launch start indication step 200. At a monitoring step 204, while FS 28 reads the application files, SSD controller 30 monitors and records the logical and respective physical addresses of the read data of the uploaded files.

At a launch termination indication step 208, SSD controller 30 accepts from OS 27 a hint that FS 28 has concluded uploading the application files, and SSD controller 30 accordingly stops the recording that was carried out at step 204. The SSD controller then re-arranges the application files to occupy a contiguous range of physical addresses, at a defragmentation step 212. Following step 212 the method terminates. The defragmentation of the application files to a contiguous physical space, makes subsequent launches of that application more efficient (i.e., using speculative prefetching) and therefore improves the user experience due to shorter launch duration.

In alternative embodiments, OS 27 hints FS 28 (rather than SSD controller 30 as in the method of FIG. 6) to start recording the logical addresses of the application files upon initiation of an application launch, and stop the recording as the application launch terminates. In such embodiments, following the launch termination, FS 28 issues to SSD controller 30, a dedicated defragmentation command. In the defragmentation command, SSD controller 30 accepts from FS 28 the logical addresses of the application files. The SSD controller then performs defragmentation by re-arranging the application files in a contiguous range of physical addresses.

The methods described above are exemplary methods, and other methods can be used in alternative embodiments. For example, although in all the above described methods the data chunk and page sizes are 4 KB and 16 KB respectively, any other suitable sizes can also be used.

As another example, although typically the VM and the FS share the same data chunk size, in alternative embodiments the above described methods can be applied with the VM and FS fetching data chunks of different sizes (both sizes are smaller than the page size.) Alternatively or additionally, the VM (or FS) can use different chunk size for different processes or applications.

The disclosed methods are applicable not only to SSD-based storage systems, but to any storage systems in which for each fetching of a missing data chunk by the VM (or FS) a page whose size is larger than the chunk size is retrieved from the underlying memory.

Although the embodiments described herein mainly address a host processor communicating with memory devices in an SSD-based storage system, the methods and systems described herein can also be used in other applications, such as in any system in which a host is configured to store data in chunks that are smaller than the storage unit used by the underlying storage device.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
receiving, by a storage device, first information specifying a first read command for a first data unit having a data unit size and an indication that the first data unit is included in an application program file;
in response to receiving the first read command:
a storage page that includes the first data unit from a first memory, wherein a size of the storage page is larger than the data unit size;
caching the storage page in a second memory;
receiving second information specifying a second read command for a second data unit, wherein the second read command specifies reading from the memory;
in response to receiving the second read command, reading the second data unit from the second memory;
receiving, by the storage device, third information specifying a third read command to read a third data unit associated with a particular physical address included in the storage page cached in the second memory; and
in response to receiving the third command, returning the third data unit and at least one data unit of remaining data units included in the storage page cached in the memory, wherein an initial data unit of the remaining data units is associated with another physical address consecutive to the particular physical address.

2. The method according to claim 1, wherein reading the second data unit comprises reporting an error event in response to detecting that the second data unit is not stored in the memory.

3. The method according to claim 1, further comprising discarding the storage page cached in the memory in response to determining all the data units included in the storage page have been requested.

4. The method according to claim 1, further comprising reporting the size of storage page.

5. The method according to claim 1, further comprising receiving, by the storage device, a write command for storing data, wherein a size of the data equals the size of the storage page, and storing the data aligned to a page boundary of the storage device.

6. The method of claim 1, wherein the memory includes a static random access memory (SRAM).

7. The method of claim 1, wherein the storage device includes a non-volatile memory.

8. A storage device, comprising:
a non-volatile memory;
a volatile memory; and
a processor configured to:
- receive first information specifying a first read command to read a first data unit having a data unit size and an indication that the first data unit is included in an application program file;
- in response to receiving the first read command:
  - read from the non-volatile memory a storage page that includes the first data unit, wherein a size of the storage page is larger than the data unit size; and
  - cache the storage page in the volatile memory;
- receive second information specifying a second read command for a second data unit, wherein the second read command specifies reading from the volatile memory;
- in response to receiving the second read command, read the second data unit from the volatile memory;
- receive third information specifying a third read command to read a third data unit associated with a particular physical address included in the storage page cached in the volatile memory; and
- in response to receiving the third read command, return the third data unit and at least one data unit of remaining data units included in the storage page cached in the volatile memory, wherein an initial data unit of the remaining data units is associated with another physical address consecutive to the particular physical address.

9. The storage device according to claim 8, wherein the processor is further configured to report an error event in response to detecting that the second data unit is not stored in the volatile memory.

10. The storage device according to claim 8, wherein the processor is further configured to discard the storage page cached in the volatile memory in response to a determination all the data units included in the storage page have been requested.

11. The storage device according to claim 8, wherein the processor is further configured to report the storage page size.

12. The storage device according to claim 8, wherein the processor is further configured to receive a write command for storing data, wherein a size of the data equals the size of storage page, and store the data aligned to a page boundary of the storage device.

13. The storage device according to claim 8, wherein the volatile memory includes a static random access memory (SRAM).

* * * * *